(12) United States Patent
Yagi

(10) Patent No.: US 9,583,644 B2
(45) Date of Patent: Feb. 28, 2017

(54) SEMICONDUCTOR OPTICAL DEVICE

(71) Applicant: SUMITOMO ELECTRIC INDUSTRIES, LTD., Osaka (JP)

(72) Inventor: Hideki Yagi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/079,615

(22) Filed: Mar. 24, 2016

(65) Prior Publication Data
US 2016/0284876 A1  Sep. 29, 2016

(30) Foreign Application Priority Data

Mar. 26, 2015 (JP) ................ 2015-064487

(51) Int. Cl.
| | |
|---|---|
| H01L 31/02 | (2006.01) |
| H01L 27/146 | (2006.01) |
| G02B 6/12 | (2006.01) |
| H01L 31/0232 | (2014.01) |
| H01L 31/0304 | (2006.01) |
| H01L 31/103 | (2006.01) |
| H01L 31/0203 | (2014.01) |
| G01B 9/02 | (2006.01) |

(52) U.S. Cl.
CPC .... H01L 31/02005 (2013.01); G01B 9/02049 (2013.01); G02B 6/12019 (2013.01); H01L 27/14643 (2013.01); H01L 31/0203 (2013.01); H01L 31/02327 (2013.01); H01L 31/03046 (2013.01); H01L 31/1035 (2013.01)

(58) Field of Classification Search
CPC ................ H01L 2223/6627; G02B 6/12019
See application file for complete search history.

(56) References Cited

U.S. PATENT DOCUMENTS 6,710,378 B1  3/2004  Makiuchi et al.
8,860,164 B2 * 10/2014  Takabayashi ......... H01L 31/105
  257/184

FOREIGN PATENT DOCUMENTS

JP  2001-127333  5/2001

\* cited by examiner

*Primary Examiner* — Thanhha Pham
(74) *Attorney, Agent, or Firm* — Smith, Gambrell & Russell, LLP.

(57) ABSTRACT

A semiconductor optical device has a substrate including a primary surface with first to fourth areas; a first conductivity-type semiconductor layer disposed on the third and fourth areas; a first semiconductor laminate disposed on the first conductivity-type semiconductor layer and the third area; a resin body disposed on the second to fourth areas; a first electrode connected with the first semiconductor laminate through a first opening of the resin body in the third area; a first pad electrode disposed on the first area; and a wiring conductor extending on a first side and a top of the resin body in the second and third areas and on the first area to connect the first electrode to the first pad electrode. The first side of the resin body is disposed in the second area. The first semiconductor laminate includes a second conductivity-type semiconductor region being in contact with the first electrode.

7 Claims, 16 Drawing Sheets

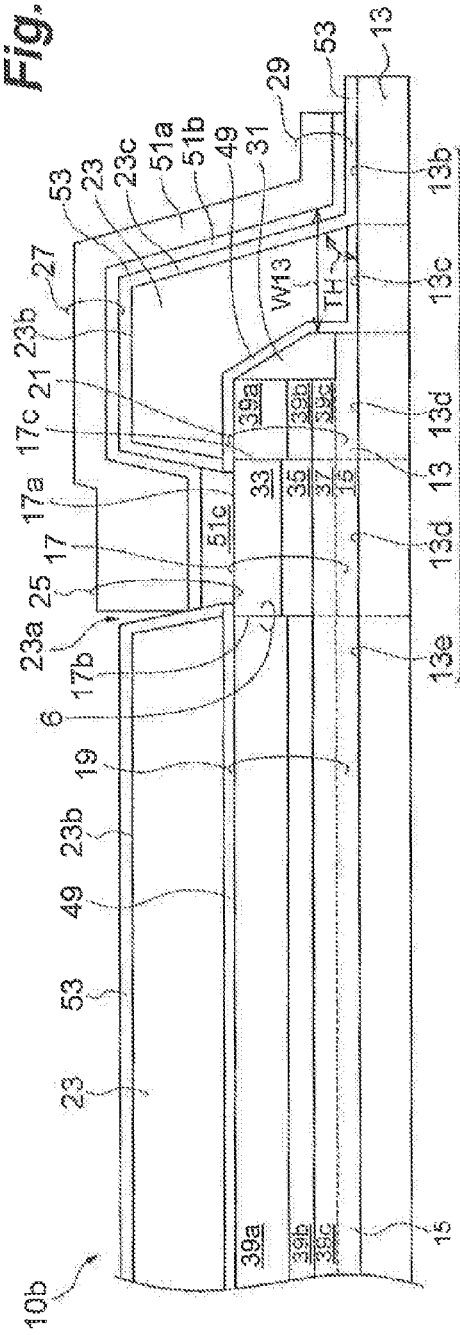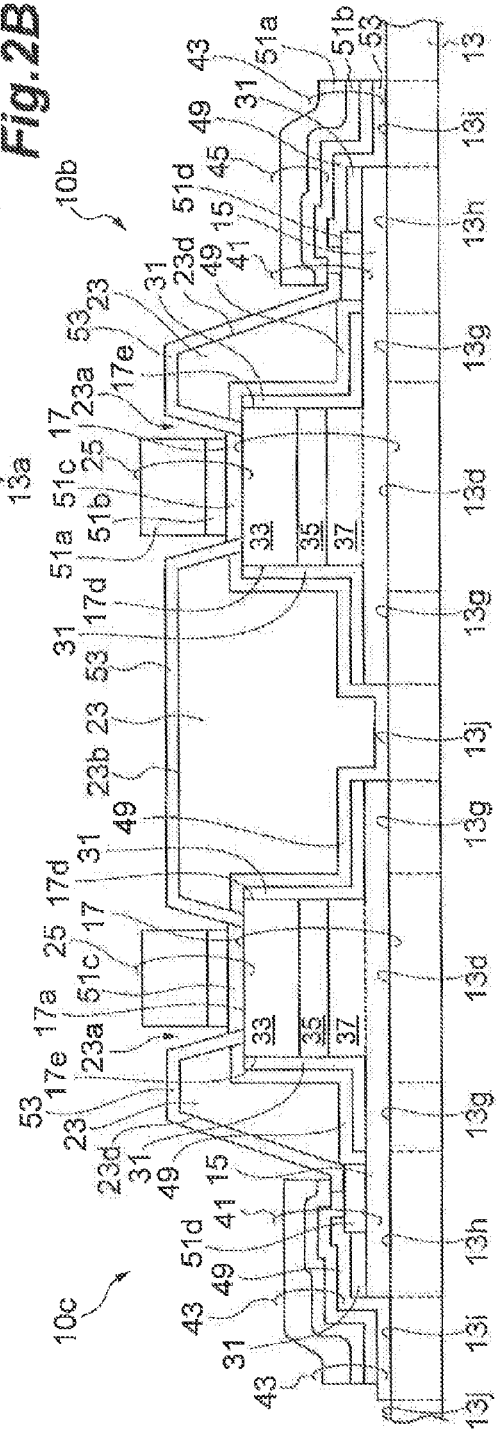

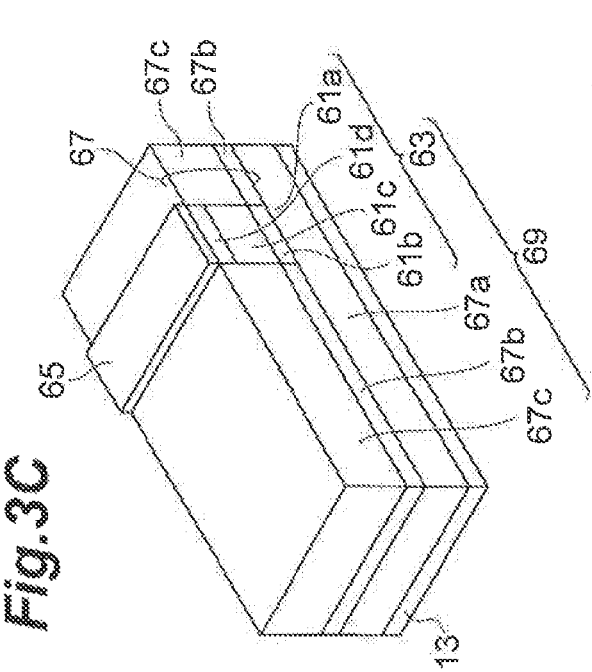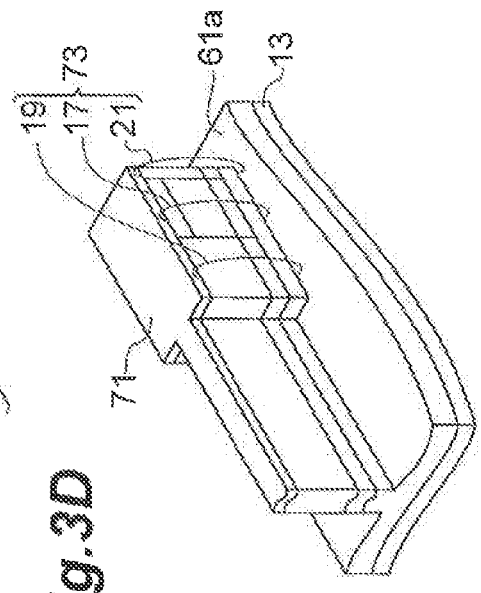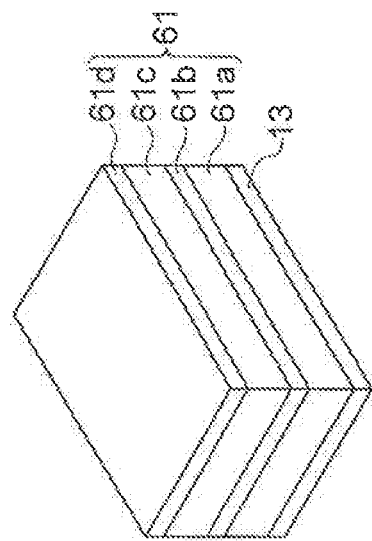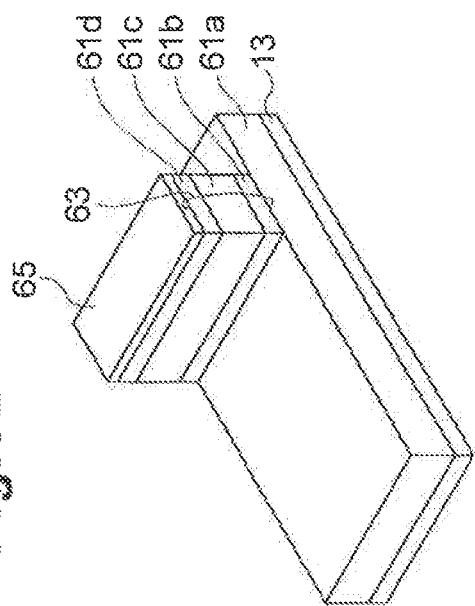

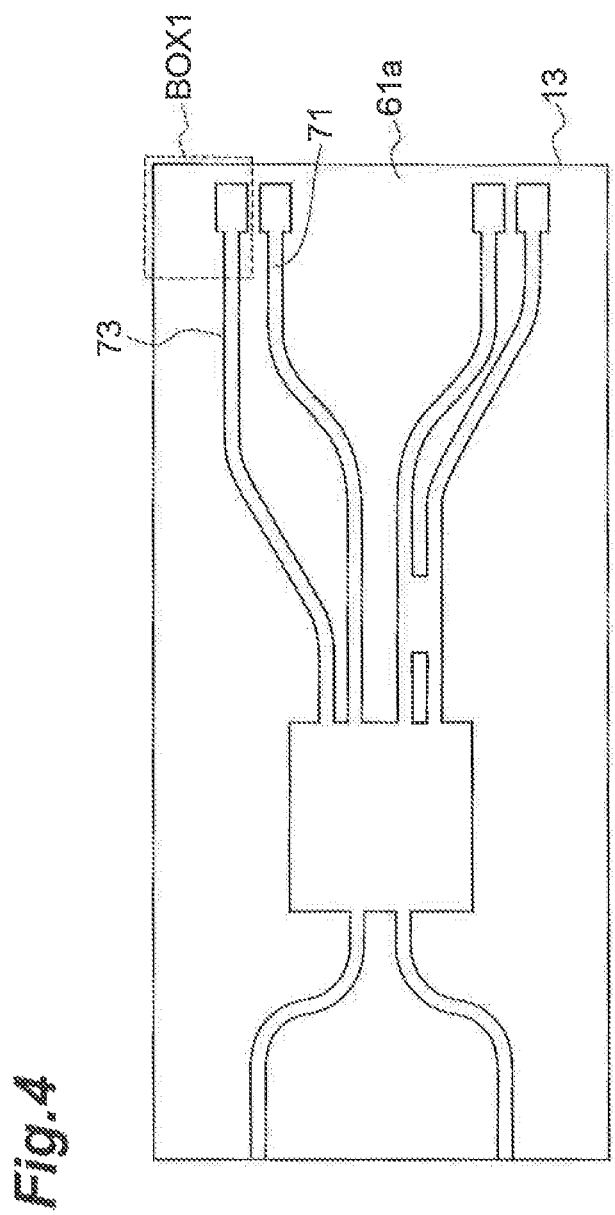

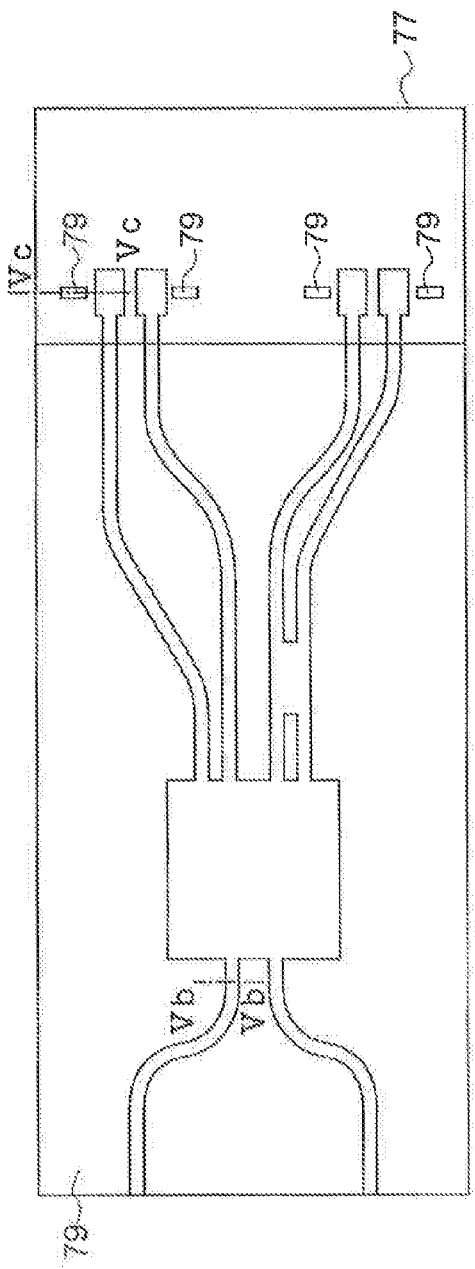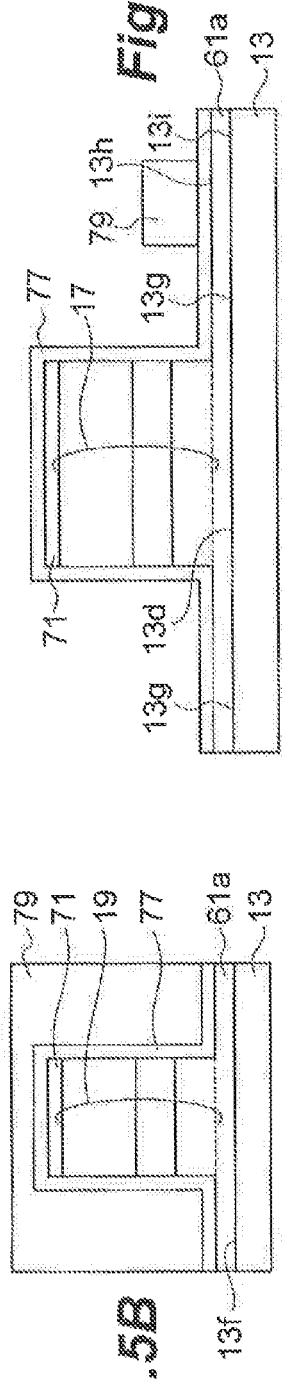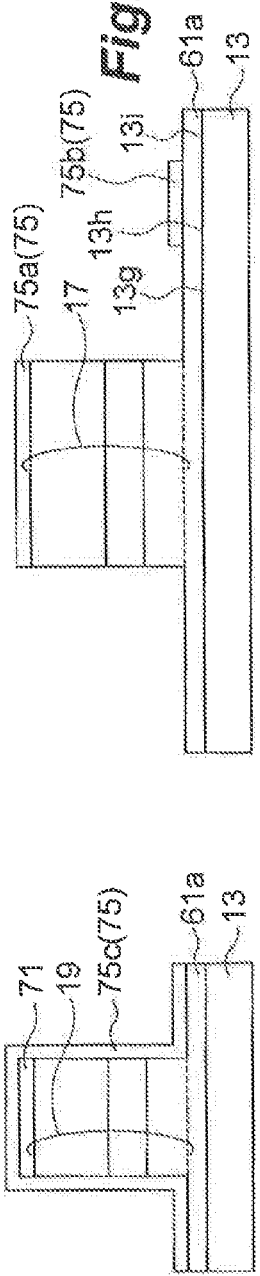

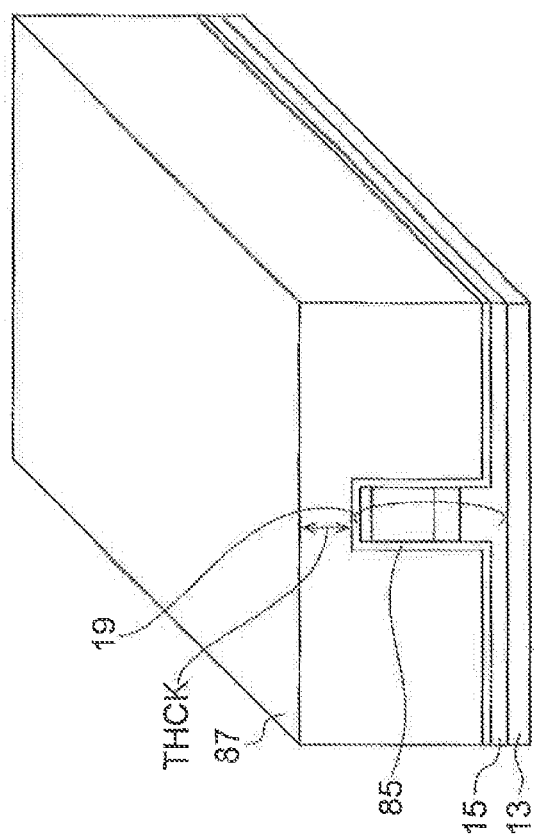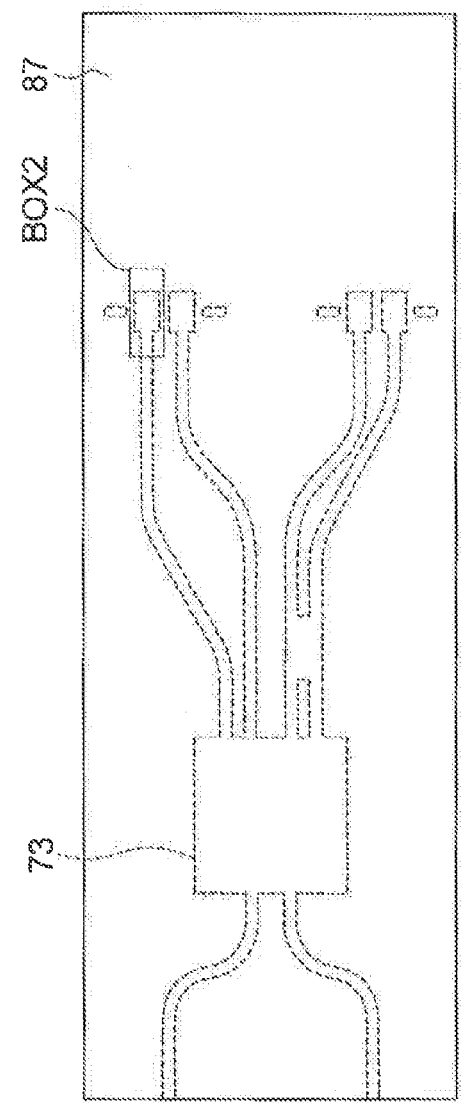

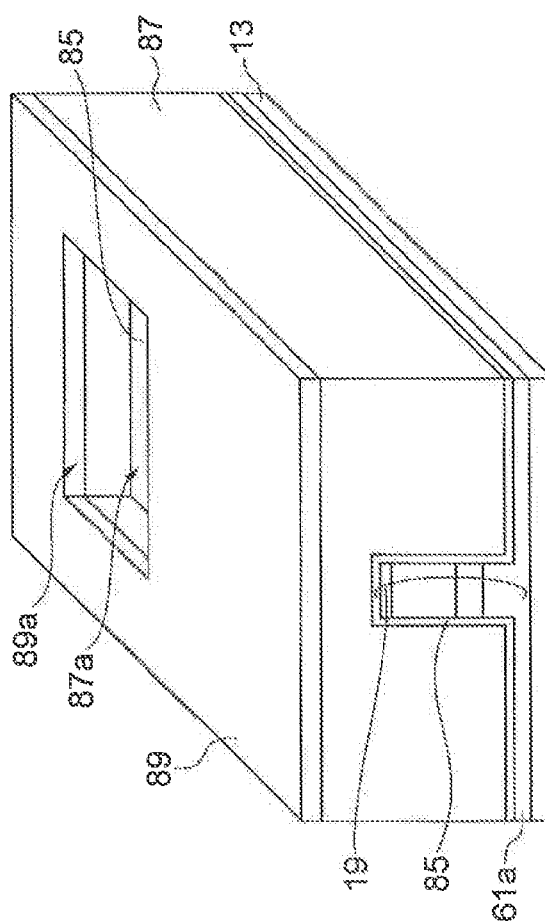
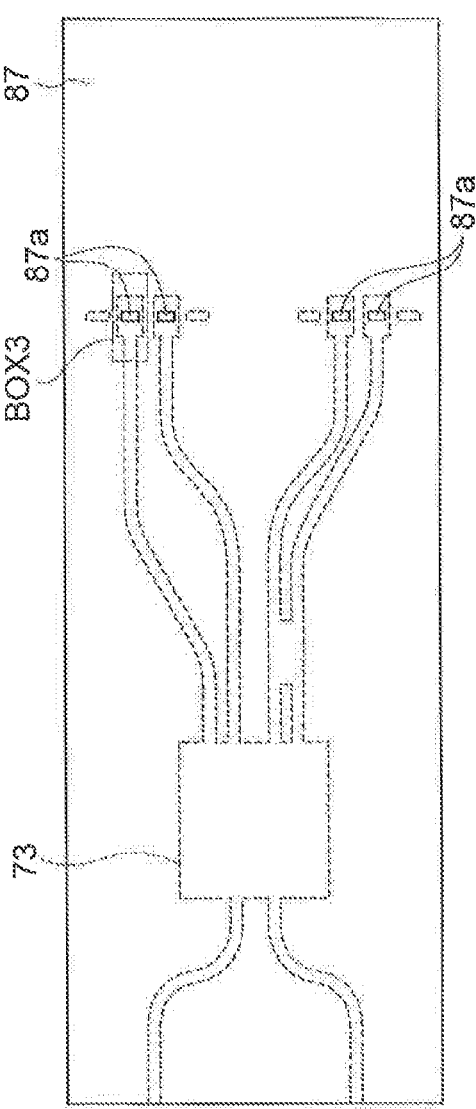

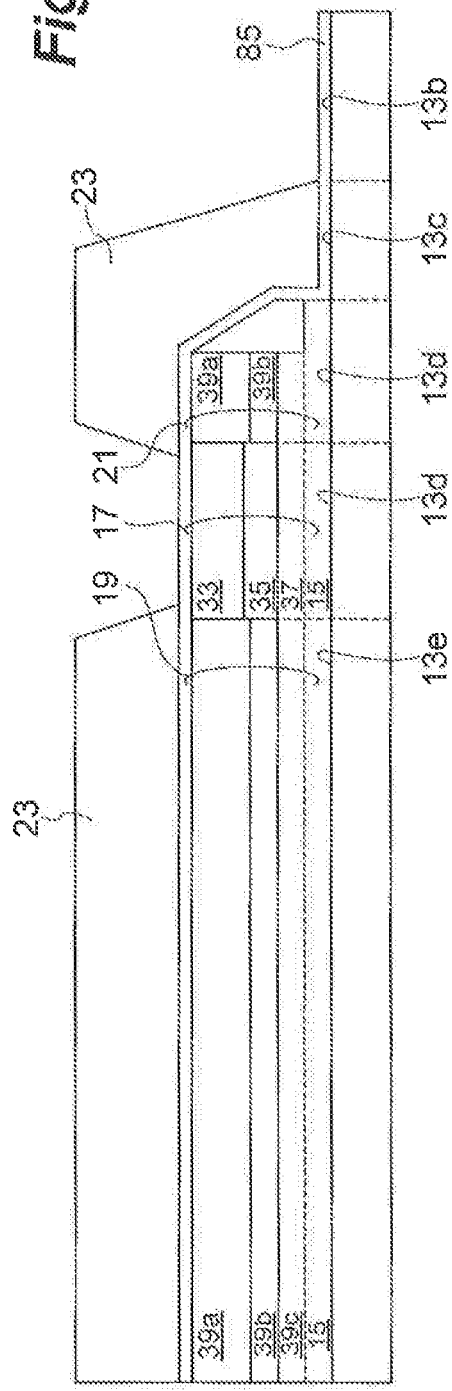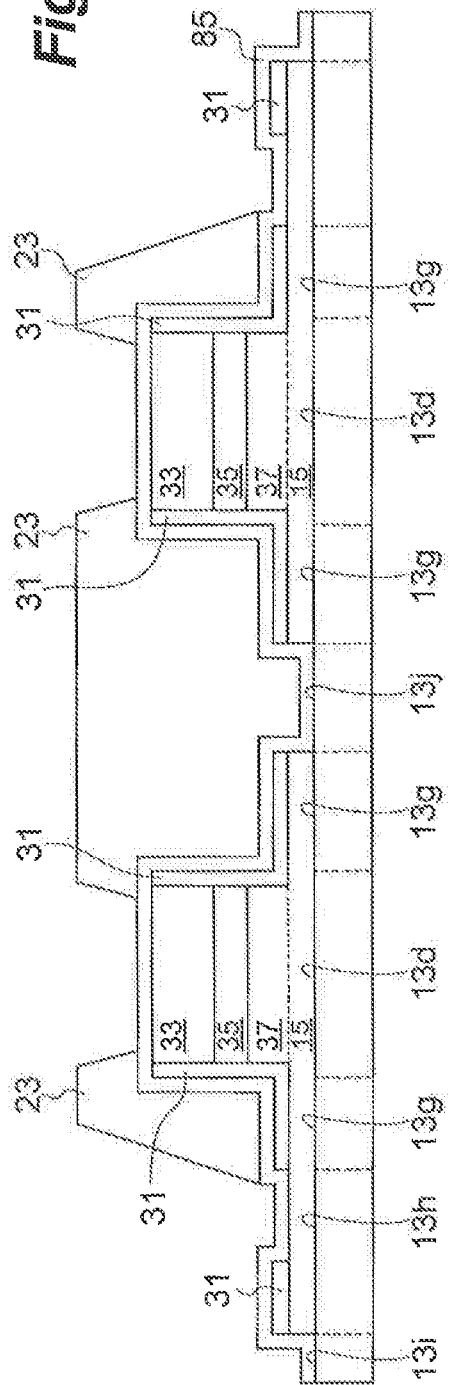

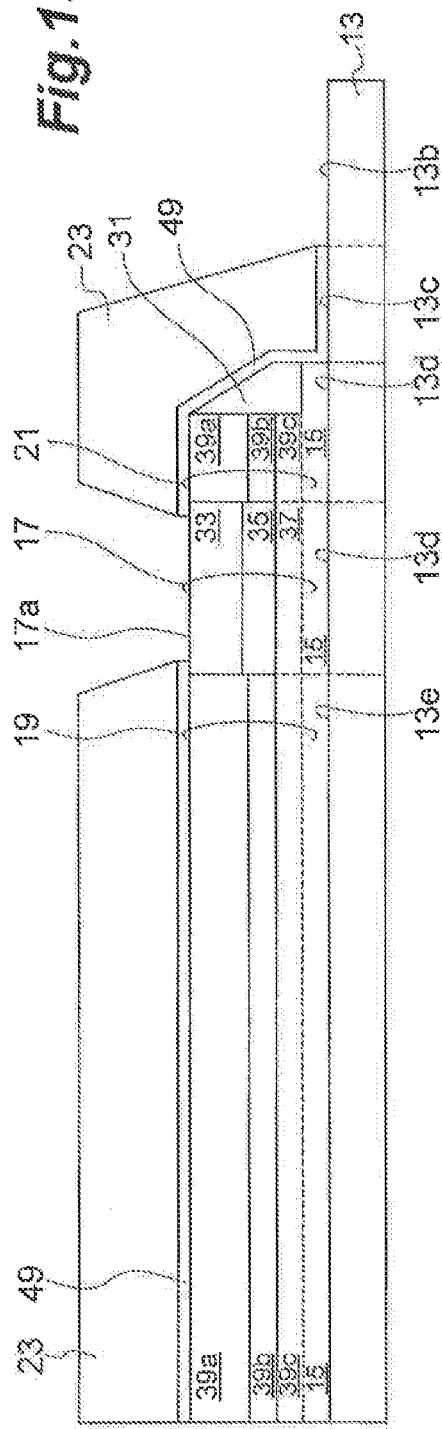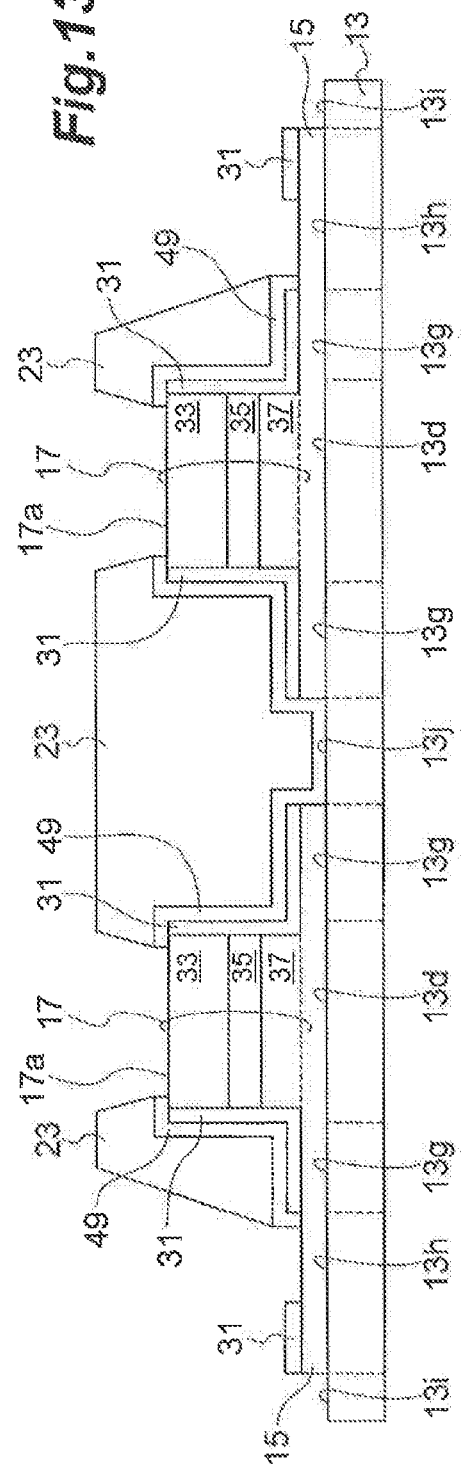

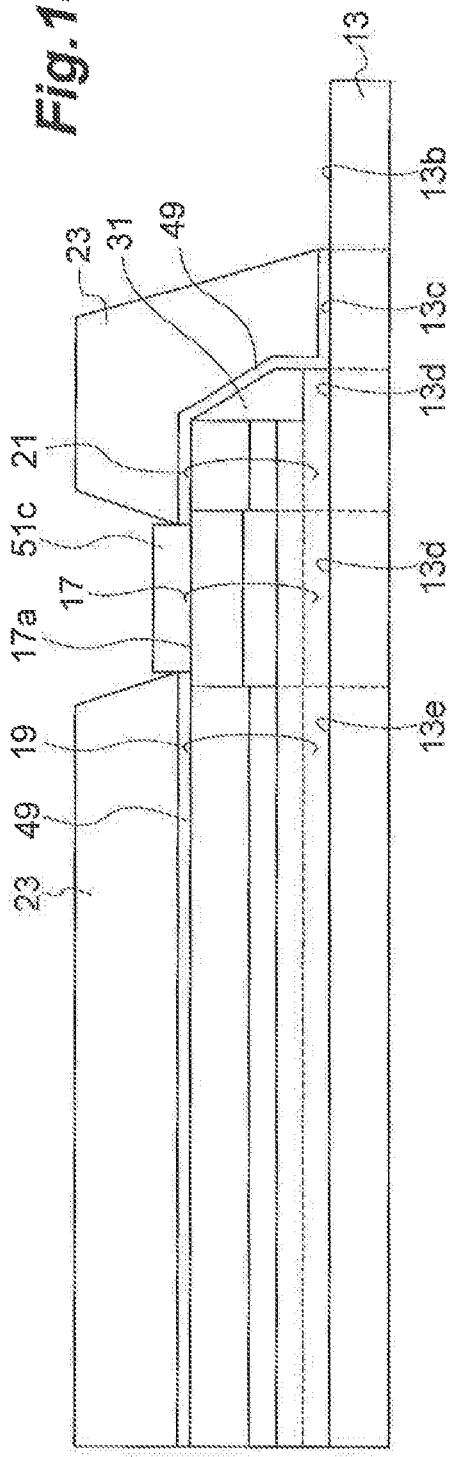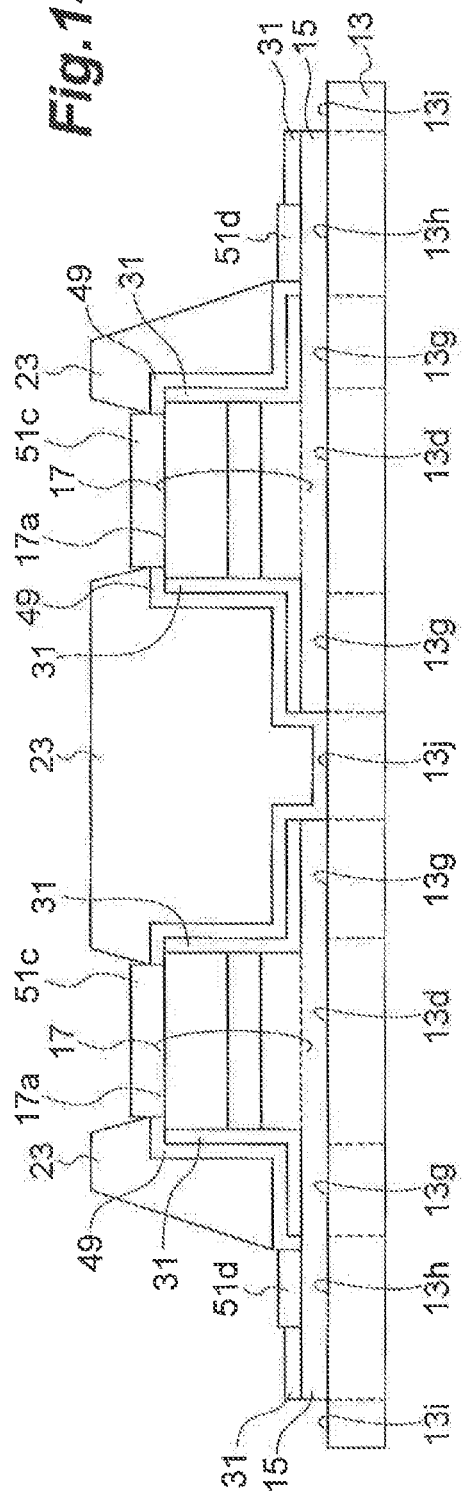

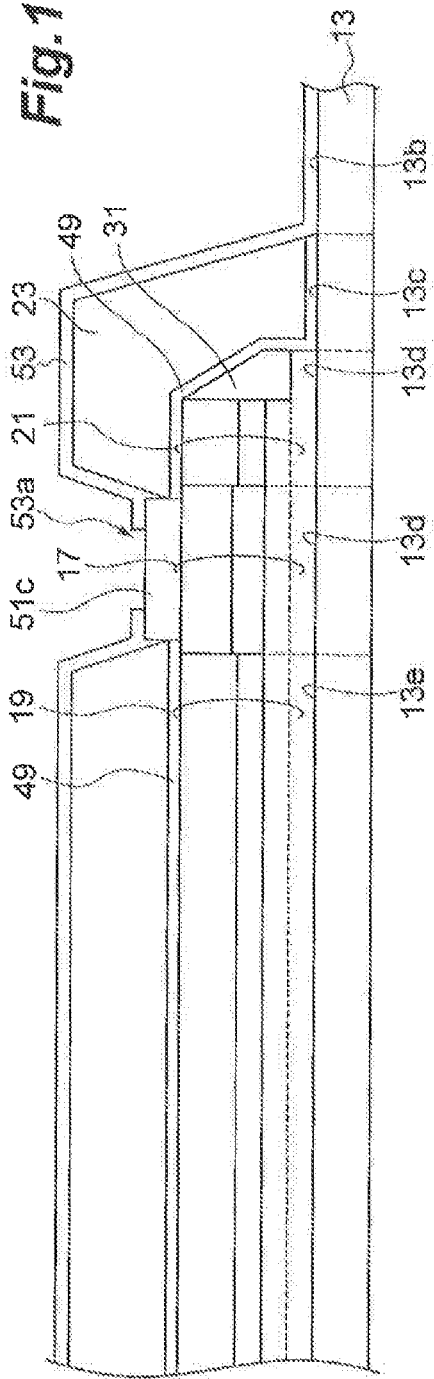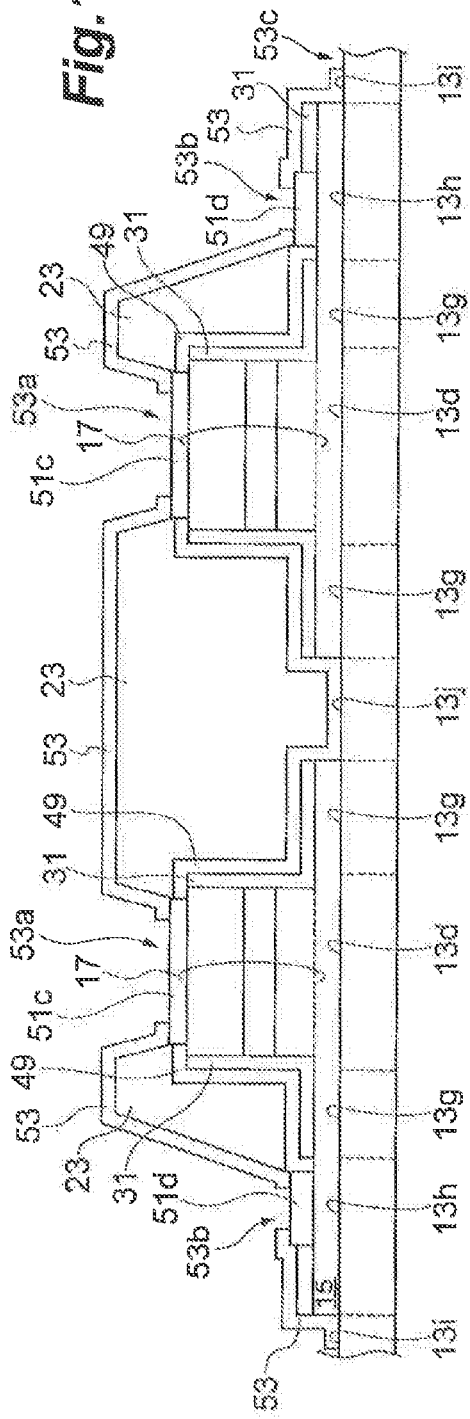

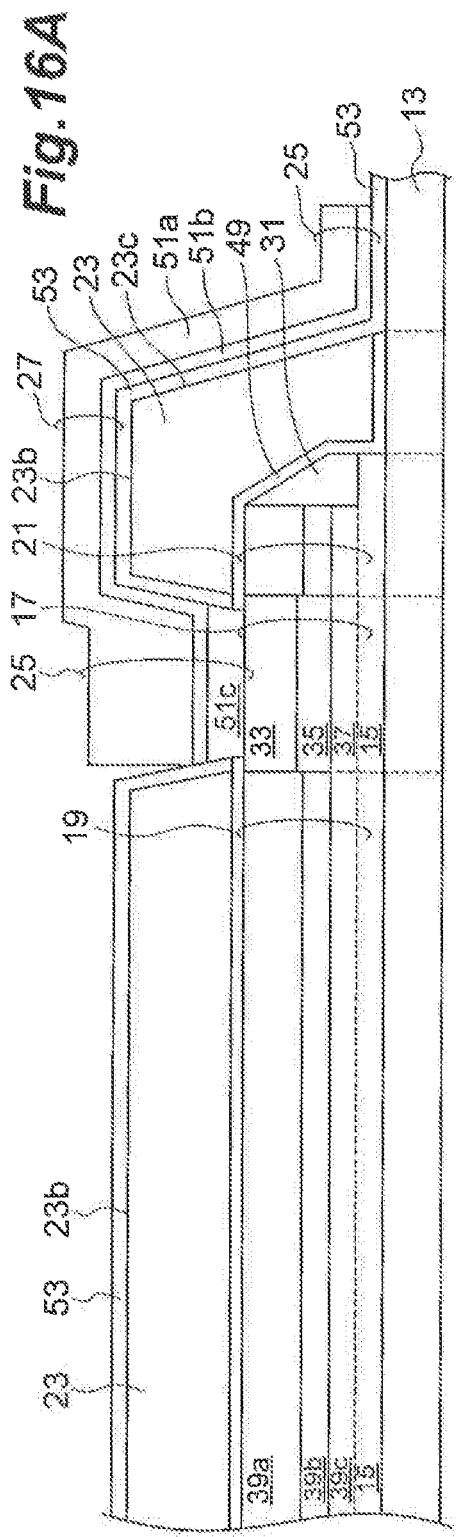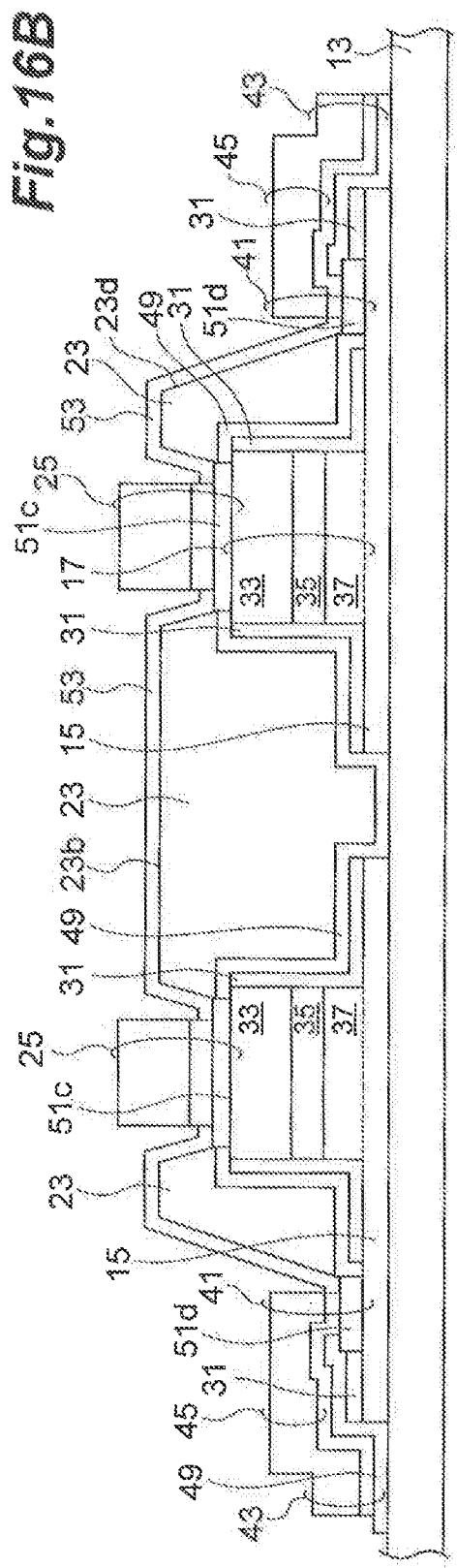

SEMICONDUCTOR OPTICAL DEVICE

BACKGROUND OF THE INVENTION

Field of the Invention

The present invention relates to a semiconductor optical device.

Related Background Art

Japanese Patent Application Laid Open No. 2001-127333 publication discloses a semiconductor light-receiving device.

SUMMARY OF THE INVENTION

Japanese Patent Application Laid Open No. 2001-127333 publication discloses an air-bridge wiring structure in order to avoid increase in parasitic capacitance on the high frequency lines. The formation of the air-bridge wiring structure requires complicated processes, and has a high degree of difficulty. For example, an air-bridge with a narrow wiring width may cause the peeling-off of the electrode for the photodiode, and an air bridge with a wide wiring width may cause resist residuals under the air bridge metal layer in the fabricating process.

Research conducted by the inventor reveals that both terminals of the photodiode are in respective potential levels different from each other and that reducing the coupling capacitance between wiring conductors for the photodiode is important. In order to reduce the coupling capacitance, the above document teaches an air-bridge wiring structure. What is needed is to avoid the above inconvenience of the air-bridge wiring structure and to reduce the capacitive coupling between the photodiode terminals of the photodiode which exhibits a reduced dark current.

It is an object of one aspect of the present invention is to provide a semiconductor optical device capable of reducing both capacitive coupling between wiring conductors associated with the photodiode, and the dark current thereof.

A semiconductor optical device according to the aspect of the present invention comprises: a substrate including a primary surface, the primary surface having first, second, third and fourth areas; a first conductivity-type semiconductor layer disposed on the third and fourth areas; a first semiconductor laminate for a photodiode, the first semiconductor laminate being disposed on the first conductivity-type semiconductor layer in the third area; a second semiconductor laminate for an optical waveguide, the second semiconductor laminate being disposed on the first conductivity-type semiconductor layer in the fourth area; a third semiconductor laminate disposed on the first conductivity-type semiconductor layer in the third area; a resin body disposed on the second, third and fourth areas; a first electrode connected with the first semiconductor laminate through a first opening of the resin body in the third area; a first pad electrode disposed on the first area; and a wiring conductor disposed on the resin body, the wiring conductor connecting the first electrode to the first pad electrode, the first semiconductor laminate having first, second, third and fourth sides, the second semiconductor laminate forming a butt-joint junction with the first side of the first semiconductor laminate to be coupled with the photodiode, the third semiconductor laminate being in contact with the second side of the first semiconductor laminate, the third and fourth sides of the first semiconductor laminate being covered with a semiconductor protective film disposed on the second area, the resin body covering the semiconductor protective film, the first semiconductor laminate, the second semiconductor laminate and the third semiconductor laminate, the first semiconductor laminate including a second conductivity-type semiconductor layer, the second conductivity-type semiconductor layer being in contact with the first electrode, the wiring conductor extending on a first side and a top of the resin body in the second and third areas and extending on the first area to the first pad electrode, and the first side of the resin body being disposed in the second area.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 2A is a cross-sectional view taken along the line IIa-IIa that shown in FIG. 1.

FIG. 2B is a cross-sectional view taken along the line IIb-IIb shown in FIG. 1.

FIG. 3A is a perspective view illustrating a product in a major process in a method for fabricating a semiconductor optical device according to the present embodiment.

FIG. 3B is a perspective view illustrating a product in a major process in the fabricating method according to the present embodiment.

FIG. 3C is a perspective view illustrating a product in a major process in the fabricating method.

FIG. 3D is a perspective view illustrating a product in a major process in the fabricating method according to the present embodiment.

FIG. 4 illustrates a product in a major processes in the fabricating method according to the present embodiment.

FIG. 5A is a plan view illustrating a product in a major process in the fabricating method according to the present embodiment.

FIG. 5B is a cross-sectional view taken along the line Vb-Vb that shown in FIG. 5A.

FIG. 5C is a cross-sectional view taken along the line Vc-Vc which is shown in FIG. 5A.

FIG. 5D illustrates a product in a major process in the fabricating method according to the present embodiment.

FIG. 5E illustrates a product in a major process in the fabricating method according to the present embodiment.

FIG. 9A is a perspective view illustrating the product in a major process in the fabricating method for fabricating a semiconductor optical device according to the present embodiment.

FIG. 9B is a plan view illustrating a product in a major process in the fabricating method according to the present embodiment.

FIG. 10A is a perspective view illustrating a product in a major process in the fabricating method according to the present embodiment.

FIG. 10B is a plan view illustrating a product in a major process in the fabricating method according to the present embodiment.

FIG. 12A is a cross sectional view taken along line XIIa-XIIa shown in FIG. 11.

FIG. 12B is a cross-sectional view taken along the XIIb-XIIb line shown in FIG. 11.

FIG. 13A is a cross sectional view, taken along the line corresponding to the XIIa-XIIa line, showing the product that is formed by applying the subsequent process to the product in FIG. 12A.

FIG. 13B is a cross sectional view, taken along the line corresponding to the XIIb-XIIb line, showing the product that is formed by applying the subsequent process to the product shown in FIG. 12B.

FIG. 14A is a cross sectional view, taken along the line corresponding to the XIIa-XIIa line, showing the product that is formed by applying the subsequent process to the product in FIG. 13A.

FIG. 14B is a cross sectional view, taken along the line corresponding to the XIIb-XIIb line, showing the product that is formed by applying the subsequent process to the product shown in FIG. 13B.

FIG. 15A is a cross sectional view, taken along the line corresponding to the XIIa-XIIa line, showing the product that is formed by applying the subsequent process to the product in FIG. 14A.

FIG. 15B is a cross sectional view, taken along the line corresponding to the XIIb-XIIb line, showing the product that is formed by applying the subsequent process to the product shown in FIG. 14B.

FIG. 16A is a cross sectional view, taken along the line corresponding to the XIIa-XIIa line, showing the product that is formed by applying the subsequent process to the product in FIG. 15A.

FIG. 16B is a cross sectional view, taken along the line corresponding to the XIIb-XIIb line, showing the product that is formed by applying the subsequent process to the product shown in FIG. 15B.

DESCRIPTION OF THE PREFERRED EMBODIMENTS

Figure 1:
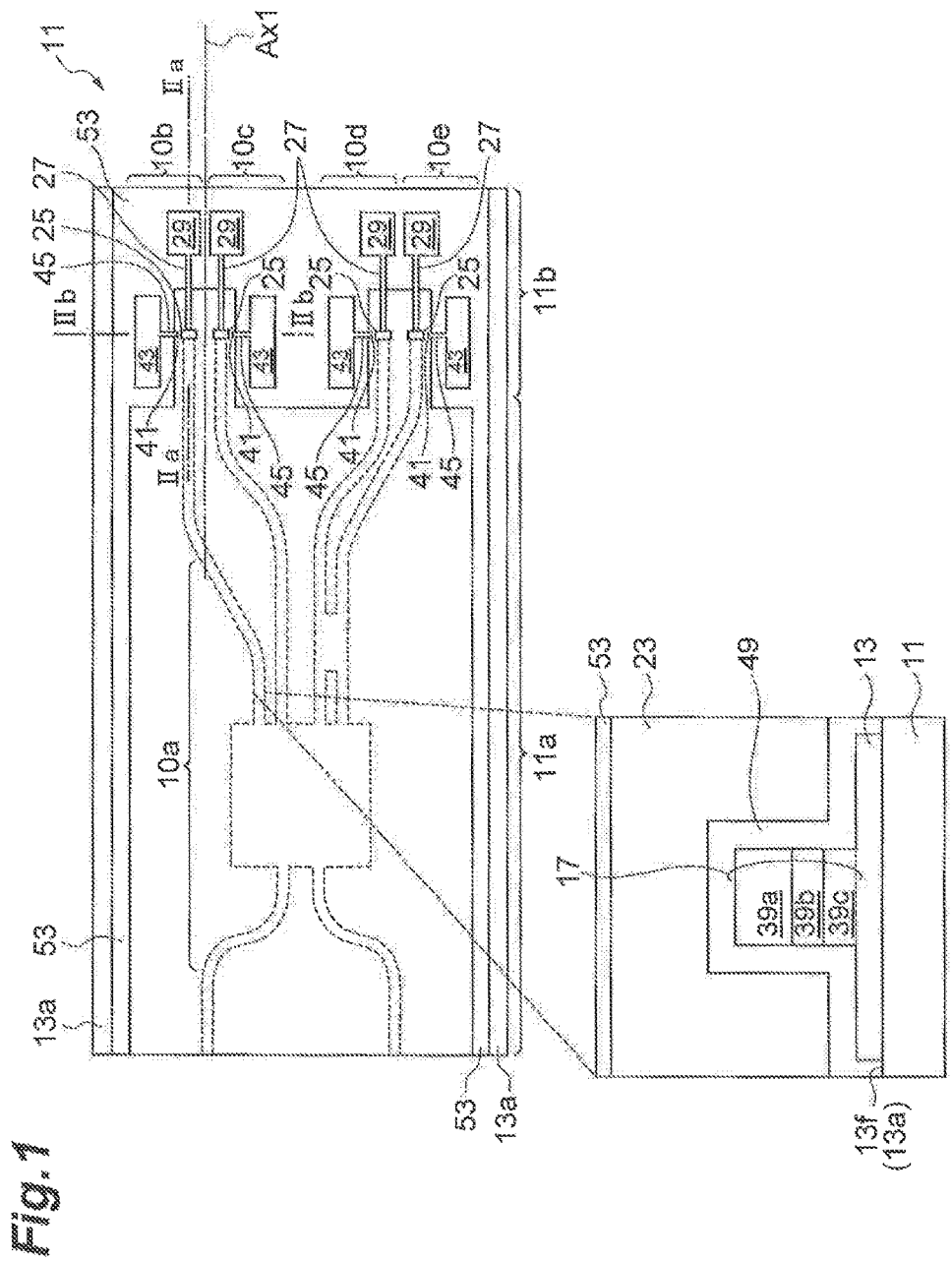
FIG. 1 is a drawing showing an exemplary structure of a semiconductor optical device according to the present embodiment.

Some specific embodiments according to the present above aspects are described below.

A semiconductor optical device comprises: a substrate including a primary surface, the primary surface having first, second, third and fourth areas; a first conductivity-type semiconductor layer disposed on the third and fourth areas; a first semiconductor laminate for a photodiode, the first semiconductor laminate being disposed on the first conductivity-type semiconductor layer in the third area; a second semiconductor laminate for an optical waveguide, the second semiconductor laminate being disposed on the first conductivity-type semiconductor layer in the fourth area; a third semiconductor laminate disposed on the first conductivity-type semiconductor layer in the third area; a resin body disposed on the second, third and fourth areas; a first electrode connected with the first semiconductor laminate through a first opening of the resin body in the third area; a first pad electrode disposed on the first area; and a wiring conductor disposed on the resin body, the wiring conductor connecting the first electrode to the first pad electrode, the first semiconductor laminate having first, second, third and fourth sides, the second semiconductor laminate forming a butt-joint junction with the first side of the first semiconductor laminate to be coupled with the photodiode, the third semiconductor laminate being in contact with the second side of the first semiconductor laminate, the third and fourth sides of the first semiconductor laminate being covered with a semiconductor protective film disposed on the second area, the resin body covering the semiconductor protective film, the first semiconductor laminate, the second semiconductor laminate and the third semiconductor laminate, the first semiconductor laminate including a second conductivity-type semiconductor layer, the second conductivity-type semiconductor layer being in contact with the first electrode, the wiring conductor extending on a first side and a top of the resin body in the second and third areas and extending on the first area to the first pad electrode, and the first side of the resin body being disposed in the second area.

In the semiconductor optical device, the second conductivity-type semiconductor region is connected to the first pad electrode through the first electrode and the wiring conductor. The wiring conductor is provided on the first area, and on the first side and upper surface of the resin body on the second and third areas. The resin body is provided on the second area in which the first conductivity-type semiconductor layer is not disposed, in addition to on the third and fourth areas in which the first conductivity-type semiconductor layer is disposed. The resin body on the second area can separate the wiring conductor, extending on the resin body, from the first conductivity-type semiconductor layer on the third and fourth areas. The first conductivity-type semiconductor layer and the second conductivity-type semiconductor region are applied to the respective potential levels different from each other. This separation can reduce the capacitive coupling between the first conductivity-type semiconductor layer and the wiring conductor that is connected to the second conductivity-type semiconductor region.

In addition, the first side, the second side, the third side and fourth side of the first semiconductor laminate are in contact with semiconductors, and the resin body covers the semiconductor protective layer, the first semiconductor laminate, the second semiconductor laminate, and the third semiconductor. Coating the sides of the semiconductor laminates with the semiconductors can reduce the dark current of the photodiode, and covering the side of the semiconductor laminates with the resin body can reduce parasitic capacitance associated with the photodiode.

In the semiconductor optical device according to the embodiment, the primary surface has a fifth area, and the semiconductor optical device further comprises a multimode interferometer, and the multimode interferometer is disposed on the fifth area and being optically coupled to the optical waveguide.

According to the semiconductor optical device, the photodiode can process a weak optical beam from the multimode interferometer (MMI) for processing a high-speed signal light beam.

In the semiconductor optical device according to the embodiment, the primary surface includes sixth, seventh and eighth areas, the first conductivity-type semiconductor layer is disposed on the sixth and seventh areas, and the resin body has a second side on the sixth area, and the semiconductor optical device further comprises a second electrode connected to the first conductivity-type semiconductor layer on the seventh area, and a second pad electrode disposed on the seventh area and connected to the second electrode.

The semiconductor optical device can separate the first pad electrode of the photodiode from the first conductivity-type semiconductor layer, and includes the second electrode connected to the first conductivity-type semiconductor layer.

In the semiconductor optical device according to the embodiment, the first side of the resin body is inclined at an angle of 70 degrees or less with respect to the primary surface of the substrate.

According to the semiconductor optical device, the side of the inclination angle within the above angle range in the vicinity of the primary surface of the substrate can prevent a steep side on the wiring path from the first electrode to the first pad electrode.

In the semiconductor optical device according to the embodiment, the first semiconductor laminate includes a light receiving layer disposed between the first conductivity-type semiconductor layer and the second conductivity-type semiconductor layer, the light receiving layer includes GaInAs, and the semiconductor protective film includes an InP protective film.

According to the semiconductor optical device, the InP protection layer makes it possible to reduce the dark current of the photodiode.

In the semiconductor optical device according to the embodiment, the resin body includes BCB resin.

According to the semiconductor optical device, BCB resins can provide the resin body with a low dielectric constant.

The semiconductor optical device according to the embodiment further comprises an inorganic insulating film disposed on the first area and the resin body, and the wiring conductor is disposed on the inorganic insulating film.

According to the semiconductor optical device, an inorganic insulating layer is effective in reducing the occurrence of the peeling-off of the wiring conductors extending on the resin body.

Teaching of the present invention can be readily understood by considering the following detailed description with reference to the accompanying drawings shown as examples. Subsequently, with reference to the accompanying drawings, embodiments of the present invention relating to a semiconductor optical device and a method for fabricating a semiconductor optical device will be explain below. When possible, parts identical to each other will be referred to as reference symbols identical to each other.

FIG. 1 is a drawing showing an example of a semiconductor optical device according to the present embodiment. The semiconductor optical device 11 includes a waveguide portion 11a and a photodiode portion 11b. The waveguide portion 11a can include at least one multimode interferometer 10a for, for example, a 90°-hybrid coupler, and the photodiode portion 11b includes photodiodes, for example, four photodiodes 10b, 10c, 10d and 10e. The multimode interferometer 10a is optically coupled to the four photodiodes 10b to 10e. Subsequent description is given with reference to the photodiode 10b, and the description also applies to the photodiodes 10c to 10e.

FIG. 2A is a drawing showing a cross sectional view taken along the line IIa-IIa shown in FIG. 1, and FIG. 2B is a cross sectional view taken along the line IIb-IIb in FIG. 1. Referring to FIGS. 2A and 2B, the semiconductor optical device 11 includes a substrate 13, a first conductivity-type semiconductor layer 15, a first semiconductor laminate 17, a second semiconductor laminate 19, a third semiconductor laminate 21, a resin body 23, a first electrode 25, a first wiring conductor 27 and a first pad electrode 29. The substrate 13 has a primary surface 13a of, for example, a semi-insulating semiconductor, and may comprise a semi-insulating InP substrate. Referring to FIG. 2A, the primary surface 13a of the substrate 13 includes a first area 13b, a second area 13c, a third area 13d and a fourth area 13e. In the present embodiment, as shown in FIG. 1, the first area 13b, the second area 13c, the third area 13d and the fourth area 13e are arranged in the direction of the waveguide axis Ax1. The first conductivity-type semiconductor layer 15 is provided over the third area 13d and the fourth area 13e, and may have p-conductivity or n-conductivity, and has n-conductivity in the present example. The first conductivity-type semiconductor layer 15 for the photodiode 10b is spaced apart from the first conductivity-type semiconductor layers 15 for other photodiodes (10c, 10d, 10e), as shown in FIG. 2B, to isolate the photodiode portion 11b from the others. The resin body 23 is disposed on the second area 13c, the third area 13d and the fourth area 13e.

The first semiconductor laminate 17 is disposed on the third area 13d for each photodiode, and is provided on the first conductivity-type semiconductor layer 15. The second semiconductor laminate 19 is disposed on the fourth area 13e for an optical waveguide for each photodiode, and is provided on the first conductivity-type semiconductor layer 15. The third semiconductor laminate 21 is disposed on the third area 13d for each photodiode, and is provided on the first conductivity-type semiconductor layer 15. The first semiconductor laminate 17 has a top 17a, a first side 17b, a second side 17c, a third side 17d and a fourth side 17e. The second semiconductor laminate 19 forms a butt-joint junction 6 with the first side face 17b of the first semiconductor laminate 17 to be optically coupled to the corresponding photodiode. The butt-joint junction 6 is located on the boundary between the third area 13d and the fourth area 13e. The third semiconductor laminate 21 is in contact with the second side 17c. The third side 17d and the fourth side 17e of the first semiconductor laminate 17 are covered with a semiconductor protective layer 31 provided on the third area 13d, and the semiconductor protective layer 31 comprises, for example, an undoped InP. In the second area 13c, the resin body 23 is provided on the semiconductor protective layer 31, the first semiconductor laminate 17, the second semiconductor laminate 19 and the third semiconductor laminate 21.

The first electrode 25 is connected to the top 17a of the first semiconductor laminate 17 through the first opening 23a of the resin body 23 in the third area 13d. The first pad electrode 29 is provided on the first area 13b. The first wiring conductor 27 is provided on the resin body 23, and connects the first electrode 25 to the first pad electrode 29. Specifically, the first wiring conductor 27 extends over the resin top 23b and first resin side 23c of the resin body 23 in the second area 13c, and on the third area 13d, and extends on the first area 13b to reach the first pad electrode 29. The first resin side 23c of the resin body 23 is located in the second area 13c.

The first semiconductor laminate 17 is provided on the first conductivity-type semiconductor layer 15, and includes the second conductivity-type semiconductor region 33 which forms a contact with the first electrode 25. The first semiconductor laminate 17 includes a light-receiving layer 35 which receives an optical beam to generate a photocurrent, and a first conductivity-type semiconductor region 37. In the first semiconductor laminate 17, the first conductivity-type semiconductor region 37, the light-receiving layer 35 and the second conductivity-type semiconductor regions 33 are arranged in order on the first conductivity-type semiconductor layer 15. The light-receiving layer 35 is provided between the second conductivity-type semiconductor region 33 and the first conductivity-type semiconductor region 37.

The second conductivity-type semiconductor region 33 has a conductivity opposite to the first conductivity-type semiconductor region 37.

The second semiconductor laminate 19 has a waveguide structure for the optical waveguide, and the waveguide structure includes an upper cladding layer 39a, a core layer 39b and the lower clad layer 39c. In the present embodiment, the third semiconductor laminate 21 has, for example, the same structure as the second semiconductor laminate 19. In the present embodiment, the lower cladding layer 39c is made of the same material as the first conductivity-type semiconductor region 37. The second semiconductor laminate 19 and the third semiconductor laminate 21 form butt-joint junctions with the first and second sides 17b, 17c of the first semiconductor laminate 17, respectively. In the present embodiment, as shown in FIG. 1, the waveguide of the waveguide portion 11a, for example, the multimode interferometer 10a for a 90°-hybrid coupler has a second semiconductor laminate 19.

In the semiconductor optical device 11, the second conductivity-type semiconductor region 33 is connected to the first pad electrode 29 through the first electrode 25 and the first wiring conductor 27. The first wiring conductor 27 is provided on the resin top 23b and the first resin side 23c of the resin body 23 in the second and third areas 13c, 13d, and on the first area 13b. The resin body 23 is provided on the second area 13c in which the first conductivity-type semiconductor layer 15 is not disposed, in addition on the third and fourth areas 13d, 13e in which the first conductivity-type semiconductor layer 15 is disposed. The width W13 of the second area 13c (see FIG. 2A) indicates the interval between the first wiring conductor 27 and the first conductivity-type semiconductor layer 15. The resin body 23 on the second area 13c can separate the first wiring conductor 27, which extends on the resin body 23, from the first conductivity-type semiconductor layer 15 in the third area 13d and the four area 13e. The first conductivity-type semiconductor layer 15 and the second conductivity-type semiconductor regions 33 are to be applied to respective potentials different from each other. This separation can reduce the capacitive coupling between the first conductivity-type semiconductor layer 15 and the first wiring conductor 27, which is connected to the second conductivity-type semiconductor region 33, without an air-bridge wiring structure.

The first side 17b, second side 17c, third side 17d, and fourth side 17e of the first semiconductor laminate 17 for the photodiode are in contact with semiconductors, and the resin body 23 covers the semiconductor protective layer 31, the first semiconductor laminate 17, the second semiconductor laminate 19 and the third semiconductor laminate 21. In the semiconductor optical device 11, covering the side of the laminate with the semiconductor can reduce the dark current of the photodiode, and the thick resin body 23 over the side and top of the semiconductor can reduce the capacitive coupling.

The tops and sides of the first semiconductor laminate 17, the second semiconductor laminate 19 and the third semiconductor laminate 21, and the surface of the first conductivity-type semiconductor layer 15 are covered with a first inorganic insulating layer 49. The first inorganic insulating layer 49 can be, for example, a silicon-based inorganic insulating film, and specifically the silicon-based inorganic insulating material includes silicon oxide (for example, $SiO_2$) and/or silicon nitride (for example SiN).

Referring again to FIG. 1, in the semiconductor optical device 11, the primary surface 13a may include a fifth area 13f, and the multimode interferometer 10a of the semiconductor optical device 11 is provided on the fifth area 13f and the photodiodes 10b to 10e are optically coupled to the respective optical waveguides. The photodiodes 10b to 10e are operable to process weak light from the multimode interferometer 10a that can process the high-speed optical signal.

As shown in FIG. 2B, the primary surface 13a of the substrate 13 includes a sixth area 13g, a seventh area 13h and a eighth area 13i. The first conductivity-type semiconductor layer 15 is provided on the sixth area 13g and the seventh area 13h, and is not provided on the eighth area 13i. The first semiconductor laminate 17 is located on the first conductivity-type semiconductor layer 15, which is located on the third area 13d. The resin body 23 is provided on the sixth area 13g. Moreover, the resin body 23 has a second resin side 23d located on the sixth area 13g, so that the resin body 23 is not provided on the seventh area 13h and the eighth area 13i. The semiconductor optical device 11 further comprises a second electrode 41 and a second pad electrode 43. The second electrode 41 is located on the seventh area 13h, and is connected to the first conductivity-type semiconductor layer 15. The second pad electrode 43 is located on the eighth area 13i, and is connected to the second electrode 41. In the present embodiment, the second electrode 41 is connected to the second pad electrode 43 via the second wiring conductor 45. In the semiconductor optical device 11, the first pad electrode 29 of the photodiode is located apart from the first conductivity-type semiconductor layer 15, and the second electrode 41 is provided on the seventh area 13h, which the resin body 23 does not cover, and is connected to the first conductivity-type semiconductor layer 15.

In the embodiment, the first electrode 25, the first wiring conductor 27, the first pad electrode 29, the second electrode 41, the second wiring conductor 45 and the second pad electrode 43 each may include a plated layer 51a and a seed layer 51b. The seed layer 51b may be patterned for plating. The first electrode 25 and the second electrode 41 include a first ohmic metal layer 51c and a second ohmic metal layer 51d, respectively, which allow for good contact between metal and semiconductor. The plated layer 51a and the seed layer 51b are disposed on the first ohmic metal layer 51c and the second ohmic metal layer 51d.

An example of the first semiconductor laminate 17 is as follows.
Second conductivity-type semiconductor region 33: p-type InP and p-type GaInAs.
Light-receiving layer 35: i-GaInAs.
First conductivity-type semiconductor region 37: n-type InP.
First conductivity-type semiconductor layer 15: n-type InP.
Semiconductor protective film 31: InP protective film, specifically undoped InP.
The first semiconductor laminate 17 includes a side forming a butt-joint junction with the second semiconductor laminate 19, a side forming a butt-joint junction with the third semiconductor laminate 21, and other sides, which the second semiconductor laminate 19 and the third semiconductor laminate 21 do not abut but are covered with the InP protective layer. The InP protective film covering the laminate can reduce the dark current of the photodiodes.

An example of the second semiconductor laminate 19 and the third semiconductor laminate 21 is as follows.
Upper cladding layer 39a: i-InP.
Core layer 39b: i-GaInAsP.
Lower cladding layer 39c: n-type InP.
Resin body 23: benzocyclobutene (BCB) resin.
Resin body 23 is not limited to BCB resin and may be another Si-containing resin.

First electrode 25 (ohmic layer/seed layer/plated layer): Ti/Pt/Au stack/TiW/plated Au.
First wiring conductor 27 (seed layer/plated layer): TiW/plated Au.
First pad electrode 29 (sheet layer/plated layer): TiW/plated Au.
Second electrode 41 (ohmic layer/seed layer/plated layer): AuGeNi alloy/TiW/plated Au.
Second wiring conductor 45 (seed layer/plated layer): TiW/plated Au.
Second pad electrode 43 (seed layer/plated layer): TiW/plated Au.

As shown in FIG. 2A, the resin body 23 is provided on the second area 13c. The width W13 of the second area 13c is defined as the interval between the first conductivity-type semiconductor layer 15 and the first wiring conductor 27 located on the first resin side 23c of the resin body 23, and corresponds to the extension of the resin body 23 on the underlying side of the first conductivity-type semiconductor layer 15. Hence, the width W13 can be determined independent of the size of the stacked semiconductor and the coating thickness of the resin body 23. The first wiring conductor 27 extends over the structure (for example, the substrate, the resin body, the inorganic insulating film) of the semiconductor optical device 11 such that the entire lower surface of the first wiring conductor 27 is supported by the structure. Moreover, the resin body 23 is located below the first wiring conductor 27 to support the lower surface of the first wiring conductor 27 everywhere, and the minimum and maximum values of the width of the first wiring conductor 27 are independent of limitations arising from air-bridge wiring structures. The dielectric constant of the resin body 23, for example, BCB resin, is lower than semiconductor dielectric constants, leading to the reduction in capacitive coupling between the first conductivity-type semiconductor layer 15 and the first wiring conductor 27 (the wiring metal of the same potential as the second conductivity-type semiconductor region 33). The width of the first wiring conductor 27 can be a small value, which is hard to be achieved by an air-bridge wiring structure, for example, 3 micrometers or less. In addition, the width of the first wiring conductor 27 can be a large value, which is hard to be achieved by the air-bridge wiring structure, for example, 10 micrometers or more.

More specifically, as shown in FIG. 2A, the resin body 23 is disposed between the bottom surface of the first wiring conductor 27 and the side faces of the first conductivity-type semiconductor layer 15 and the first conductivity-type semiconductor region 37. The width W13 may be, for example, 20 micrometers or more. Meanwhile, the thickness of the resin body 23 may be, for example, 2.0 micrometers or more on the upper surface of the semiconductor laminate.

The first resin side 23c (and the second resin side 23d) of the resin body 23 can form an angle TH of 70 degrees or less with respect to the primary surface 13a of the substrate 13 at the lower end of these sides. This angular range can prevent the resin body from having a steep side on the wiring path from the first electrode 25 to the first pad electrode 29, and makes it easy to deposit the inorganic film and form the metal wiring on the first resin side 23c and the second resin side 23d.

Semiconductors on the first area 13b, the eighth area 13i, and the top and sides of the resin body 23 are covered with the second inorganic insulating layer 53. The second inorganic insulating layer 53 may be, for example, a silicon-based inorganic insulating film, such as silicon oxynitride (e.g., SiON), silicon oxide (e.g., $SiO_2$) and silicon nitride (e.g., SiN).

The first wiring conductor 27 and the second wiring conductor 45 extend over the second inorganic insulating layer 53. The second inorganic insulating layer 53 is effective in reducing the occurrence of the peeling-off of the metal layer, such as the first wiring conductor 27 and the second wiring conductor 45 extending on the resin body 23. The second inorganic insulating layer 53 has an opening located on the top 17a of the first semiconductor laminate 17 and an opening on the semiconductor layer 15 of the first conductivity-type located on the seventh area 13h. Through these openings, the first electrode 25 and the second electrode 41 make contact with the second conductivity-type semiconductor region 33 and the first conductivity-type semiconductor region 37, respectively.

The first area 13b, the second area 13c, the third area 13d, the fourth area 13e and the fifth area 13f are arranged sequentially in the direction of the waveguide axis Ax1, and in the present embodiment, the two adjacent areas among these areas may be adjoined to each other. The third area 13d, the sixth area 13g, the seventh area 13h and the eighth area 13i are arranged sequentially in a direction intersecting the waveguide axis Ax1, and in the present embodiment, the two adjacent areas among these areas may be adjoined to each other. The ninth area 13j is disposed for electrical isolation between the photodiodes, and for this purpose, the first conductivity-type semiconductor layer 15 is not disposed in the ninth area 13j.

The method for fabricating a semiconductor optical device 11 according to the present embodiment will be described below. When possible, in order to facilitate the understanding, the reference symbols applied to the semiconductor optical device 11 are used in the description of the method. FIGS. 3 to 15 show the major steps in a method for fabricating a semiconductor optical device 11 according to the present embodiment. For simplicity, the area of one device size is illustrated in the drawings.

In the embodiment of the fabricating method, a semiconductor base for the substrate 13 is prepared. The semiconductor base, such as a semiconductor wafer, which is referred to as "substrate 13," may be, for example, a semi-insulating InP substrate (Fe-doped InP substrate). As shown in FIG. 3A, a first semiconductor laminate 61 for the photodiode is grown over the entire surface of the substrate 13. This growth can be carried out by such metal-organic vapor phase deposition. For the production of the first semiconductor laminate 61, an n-type InP contact layer 61a, an i-GaInAs absorbing layer 61b, a p-type InP cladding layer 61c, and a p-type GaInAs contact layer 61d are grown in order on a semi-insulating InP substrate in a growth reactor.

Then, as shown in FIG. 3B, a butt-joint mesa 63 is formed by etching from the first laminate semiconductor layer 61. A silicon nitride film (a SiN film with a thickness of 200 nm) is deposited by chemical vapor deposition (CVD) for forming a mask for an etching process, and the silicon nitride film is processed by photolithography and etching using buffered hydrofluoric acid (BHF) to form a butt-joint mask 65 of silicon nitride. The butt-joint mesa 63 is formed by etching the $p^+$-type GaInAs contact layer 61d, the p-type InP cladding layer 61c, and the i-GaInAs light-receiving layer 61b using HCl-based or HBr-based etchant with the butt-joint mask 65 sequentially, and the n-type InP contact layer 61a is used as an etch stop layer in the etching of the i-GaInAs absorbing layer 61b.

As shown in FIG. 3C, a second semiconductor laminate 67 for the optical waveguide is grown on the substrate 13 in the growth reactor with the butt-joint mask 65 being left without the removal. This growth can be carried out by, for example, metal-organic vapor phase deposition. For the production of the second semiconductor laminate 67, an i-GaInAsP core 67b and an i-type InP cladding layer 67c are grown sequentially in the growth reactor on the n-type InP contact layer 61a located on the semi-insulating InP substrate. This growth can form a semiconductor laminate 69 including a butt-joint structure on the substrate 13. The formation of the semiconductor laminate 69 is followed by the removal of the butt-joint mask 65.

As shown in FIG. 3D, a silicon nitride film (a SiN film with a thickness of 300 nm) is deposited on the semiconductor laminate 69 by CVD, and the silicon nitride film is processed by photolithography and reactive ion etching ($CF_4$ gas used as etchant) to form a waveguide mask 71 of silicon nitride. The waveguide mask 71 has a pattern for 90°-hybrid coupler and photodiodes (PDs). The application of reactive ion etching ($Cl_2$ gas used as etchant) with the waveguide mask 71 to the semiconductor laminate 69 forms a mesa structure 73. The mesa structure 73 includes the first semiconductor laminate 17, the second semiconductor laminate 19 and the third semiconductor laminate 21. In order to avoid complexity, FIG. 3D, unlike FIGS. 3A and 3B, illustrates a region including the first semiconductor laminate 17, the second semiconductor laminate 19 and the third semiconductor laminate 21. Meanwhile, FIG. 4 is a plan view showing a mesa structure 73 in the area of a single device size. FIG. 4 shows semiconductor mesas for the four photodiodes and the single 90°-hybrid coupler depicted in FIG. 1. FIG. 3D shows the portion indicated by reference symbol BOX1 shown in FIG. 4.

FIGS. 5A, 5B, 5C and 5D illustrate the fabrication of a selective growth mask 75 to be used for growth of the semiconductor protective layer. FIG. 5A is a plan view showing a selective growth mask 75 in a single device area. FIG. 5B is a cross sectional view taken along the line Vb-Vb shown in FIG. 5A, and FIG. 5C is a cross sectional view taken along Vc-Vc line shown in FIG. 5A. FIGS. 5B and 5C show the processing step in which the resist mask 79 is left before the etching at these cross sections, whereas FIGS. 5D and 5E show the processing step in which the resist mask 79 has been removed after the etching at the above cross-sections. FIGS. 5B and 5C are associated with FIGS. 5D and 5E, respectively.

With the waveguide mask 71 being left, the silicon nitride film 77 (for example, the SiN film having a thickness of 100 nm) is grown on the waveguide mask 71 by CVD, and a resist mask 79 is formed by photolithography on the silicon nitride film. The resist mask 79 covers a region where a semiconductor protective layer 31 should be grown. The application of an etching with the mask 79 by buffered hydrofluoric acid (BHF) to the silicon nitride forms a selective growth mask 75 from both the waveguide mask 71 and the silicon nitride film 77. The silicon nitride film 75a of the selective growth mask 75 is left on the upper surfaces of the first semiconductor laminate 17, the second semiconductor laminate 19 and the third semiconductor laminate 21, and the silicon nitride film is not left on the sides of the first semiconductor laminate 17, the second semiconductor laminate 19 and the third semiconductor laminate 21. For the connection between the second electrode and the semiconductor region, the silicon nitride film 75b of the selective growth mask 75 is left in the seventh area 13h to prevent the growth of the semiconductor protective layer onto the seventh area 13h. The silicon nitride film 75c of the selective growth mask 75 is left on the 90°-hybrid coupler on the fifth area 13f to prevent the growth of the semiconductor protective film onto the fifth area 13f.

Figure 6:
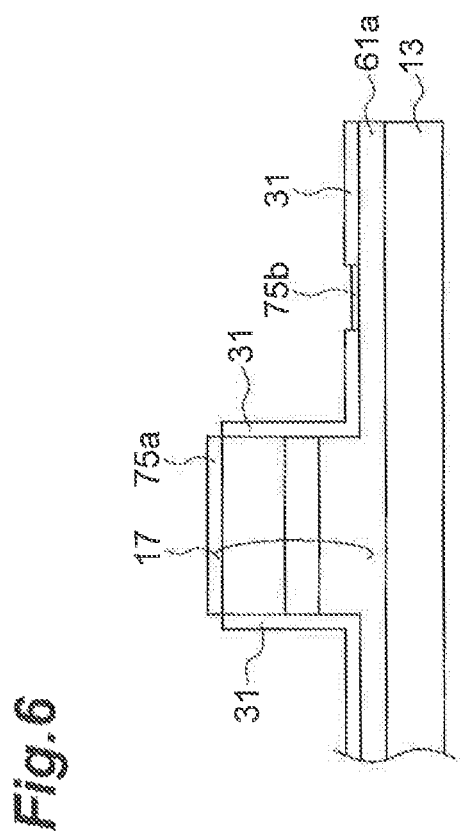
FIG. 6 is a drawing showing a major process in the fabricating method according to the present embodiment.

In order to remove the damaged layer that the dry etching process may form, HCl-based wet etching is performed thereto. Thereafter, a semiconductor protective layer 31 (e.g., undoped InP having a thickness of 200 nm or more) is grown with a mask 75 for selective growth. This growth is performed, for example, by metal organic vapor phase deposition. FIG. 6 is a cross-sectional view showing a progress of the product in FIGS. 5C and 5E. The silicon nitride film is not left over the sides of the first semiconductor laminate 17, the second semiconductor laminate 19 and the third semiconductor laminate 21, so that the semiconductor protective layer 31 is grown thereon. The semiconductor protective layer 31 does not cover the semiconductor region for the 90°-hybrid coupler and the photodiode, specifically, the tops of the first semiconductor laminate 17, the second semiconductor laminate 19 and the third semiconductor laminate 21, but covers the sides of the first semiconductor laminate 17, the semiconductor laminate 19 and the third semiconductor laminate 21. This coating contributes to the reduction of the dark current of photodiodes. After the selective growth of the semiconductor protective film 31, the mask 75 for selective growth is removed using, for example, buffered hydrofluoric acid (BHF).

Figure 7:
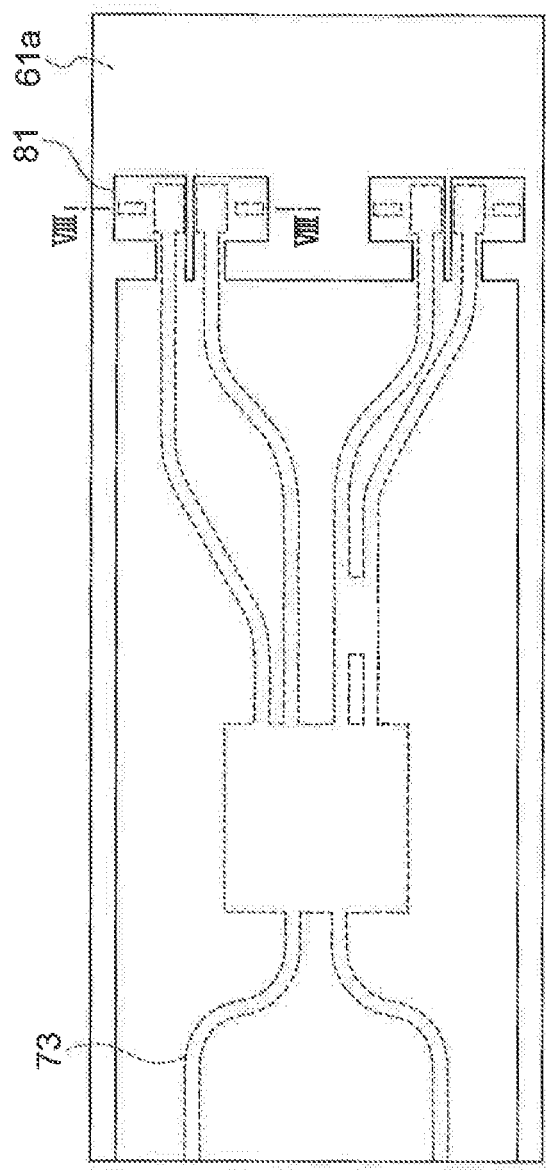
FIG. 7 is a drawing showing a major process in the fabricating method according to the present embodiment.
Figure 8:
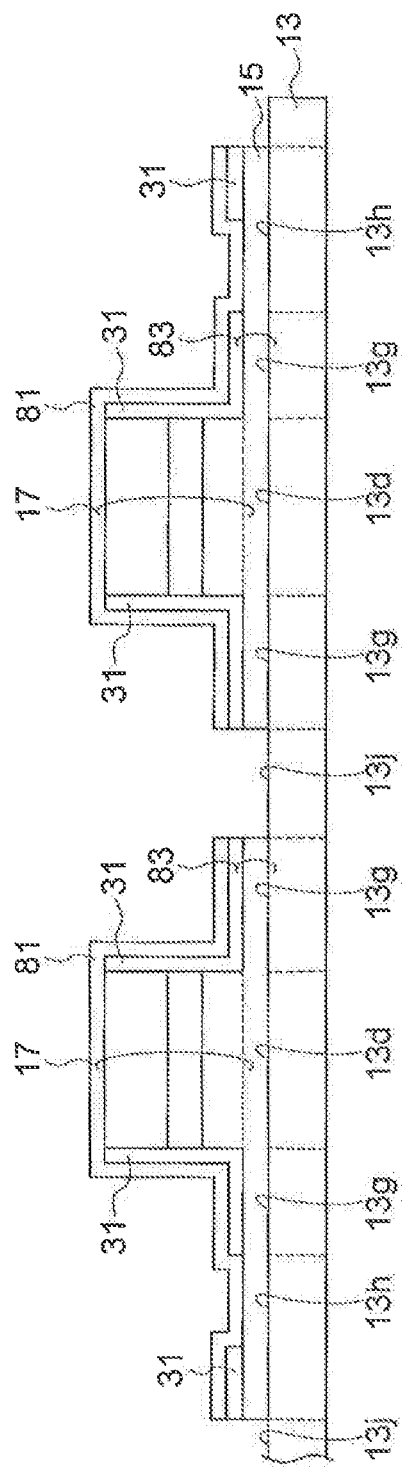
FIG. 8 is a drawing showing a major process in the fabricating method according to the present embodiment.

Subsequently, the process to isolate photodiodes is performed. An isolation mask 81 for isolation etching is formed. In order to form the mask 81, a silicon nitride film (a thickness of 300 nm SiN film) is deposited by CVD on the semiconductor laminate 69, and photolithography and reactive ion etching ($CF_4$ gas is used) are applied to the silicon nitride film to form the isolation mask 81 from the silicon nitride film. FIG. 7 shows a pattern of the isolation mask 81 in the area of a single device size. As seen from the device structure shown in FIGS. 1, 2A and 2B, the isolation mask 81 has respective openings located on the first area 13b, the second area 13c, the eighth area 13i and the ninth area 13j, and another opening located on the boundary between device sections in the device array. The isolation mask 81 covers the semiconductor area on the third area 13d, the fourth area 13e, fifth area 13f, the sixth area 13g and the seventh area 13h. The n-type InP contact layer 61a is etched with an isolation mask 81 to form the isolation mesa 83 including the first conductivity-type semiconductor layer 15. This etching process removes the n-type InP contact layer 61a, such an n-type InP by, for example, $Cl_2$-based reactive ion etching to expose the substrate 13, such as Fe-doped InP substrate in the area for device isolation. FIG. 8 is a cross-sectional view taken along the line VIII-VIII in FIG. 7. The n-type InP contact layer 61a is partially removed to form the isolation of four photodiodes (two photodiodes are illustrated in the drawings). After forming the device isolation among the photodiodes, the isolation mask 81 is removed.

The removal of the isolation mask 81 exposes the semiconductor surface. As shown in FIG. 9A, a protective film 85 made of an inorganic insulating material is grown on the semiconductor surface. In the present embodiment, the protective film 85 is made of a silicon-based inorganic insulating layer, in particular comprising a silicon oxide film (for example, $SiO_2$ having a thickness of 200 nm). After this film formation, as shown in FIGS. 9A and 9B, a resin film 87 is applied over the entire substrate to cover the protective film 85. The thickness THCK of the resin film 87 is preferably about 2 micrometers or more, for example, on the second semiconductor laminate 19. The resin film 87 comprises, for example, a benzocyclobutene (BCB) resin. FIG. 9A shows the area of BOX2 shown in FIG. 9B.

Subsequently, in order to make electrical contact to the first semiconductor laminate 17 for the photodiodes, as shown in FIGS. 10A and 10B, an opening 87a is formed in the resin film 87. In order to form the opening, a resist mask 89 is formed as shown in FIG. 10A. The resist mask 89 has an opening 89a on the first semiconductor laminate 17. The resin film 87 is etched with the resist mask 89 to form the opening 87a on the first semiconductor laminate 17. The etching is carried out by reactive ion etching using an etchant, for example, $CF_4/O_2$ gas. The underlying protective film 85 appears at the opening 89a. The parts of the resin film 87 that are covered with the resist mask are not etched.

Figure 11:
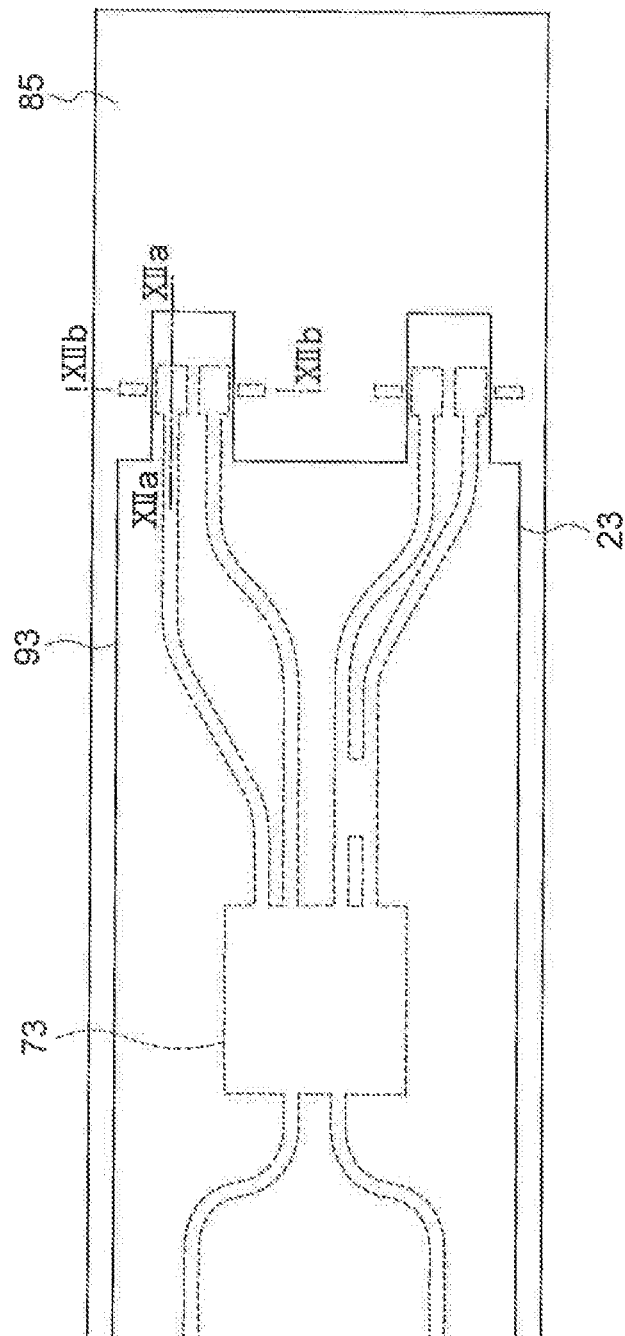
FIG. 11 is a plan view illustrating a product in a major process in the fabricating method according to the present embodiment.

Next, the resin film 87 is removed in the n-side contact area, the pad area and the device section area. As shown in FIG. 11, a second resist mask 93 is formed by photolithography. As seen from the device structure shown in FIGS. 1, 2A and 2B, specifically, the second resist mask 93 has respective openings located in the first area 13b, the third area 13d, the seventh area 13h and the eighth area 13i (if necessary, the ninth area 13j), and covers a semiconductor region in the second area 13c, the fourth area 13e, the fifth area 13f and the sixth area 13g. The resin film 87 is etched with the second resist mask 93 to remove parts of the resin film 87 which are located on the first area 13b, the third area 13d, the seventh area 13h and eighth on the area 13i, whereby the protective layer appears therein. This etching is performed by reactive ion etching using a $CF_4/O_2$ gas. After the etching to form the resin body 23, the second resist mask 93 is removed. In this etching process, the resin film 87 is partially removed, so that the protective film 85 appears partially thereat. The etching of the resin film 87 is carried out such that the sides of the opening 87a and the resin body 87 do not become perpendicular to the primary surface 13a of the substrate 13. Specifically, in forming the resist mask 89 and the second resist mask 93, a resist film is subjected to post-baking (heat treatment after photolithography). This baking causes the resist mask to deform (a sloped side of the resist mask to form a forward-mesa shape) to round the edge of the resist mask. The rounded edge shape of the resist mask is transferred to the BCB resin during the etching of the BCB resin, so that the BCB resin has an oblique side of an inclination angle of 70 degrees or less.

FIG. 12A shows a cross section corresponding to the line XIIa-XIIa shown in FIG. 11, and FIG. 12B shows a cross section corresponding to the XIIb-XIIb line shown in FIG. 11. After partially removing the resin film 87 to form the resin body 23, the protective film 85 is etched using a resin body 23 as a mask to form a first inorganic insulating layer 49. The protective film 85 has a part located on the top 17a of the first semiconductor laminate 17, a part on a first area 13b, a part on the first conductivity-type semiconductor laminate 15 in the seventh area 13h, and a part on the eighth area 13i, and these parts of the protective film 85 are not covered with the resin body 23, so that these parts of the protective film 85 is etched. This etching results in that the top 17a of the first semiconductor laminate 17 appears in the third area 13d; the first semiconductor layer 15 appears in the seventh area 13h; and the semi-insulating semiconductor appears in the eighth area 13i and the first area 13b in which the pad electrode is to be formed. The lower ends of the side of the first inorganic insulating layer 49 and the resin body 23 are located at the boundary between the first area 13b and the second area 13c, whereas the side (end) of the first conductivity-type semiconductor layer 15 and the side (end) of the semiconductor protective film 31 are located at the boundary between the seventh area 13h and the eighth area 13i.

FIG. 13A shows a cross section corresponding to that of FIG. 12A, and FIG. 13B shows a cross section corresponding to that of FIG. 12B. The protective film 85 partially removed. In the present embodiment, as shown in FIGS. 13A and 13B, the removal of the protective film 85 is performed by reactive ion etching using an etchant of $CF_4$ gas with the mask of the resin body 23. This etching of the protective film 85 cannot etch the semiconductor.

FIG. 14A shows a cross section corresponding to that of FIG. 12A, and FIG. 14B shows a cross section corresponding to that of FIG. 12B. After removing the protective film 85, photolithography and sputtering can be used to form a first ohmic metal layer 51c (or the first ohmic electrode) and a second ohmic metal layer 51d (or the second ohmic electrode). The first ohmic metal layer 51c thus formed is in direct contact with the top of the first semiconductor laminate 17 in the third area 13d. The second ohmic metal layer 51d thus formed is in direct contact with the top of the semiconductor layer 15 of the first conductivity-type in the seventh area 13h.

FIGS. 15A and 15B show the respective cross sections in which the first ohmic metal layer 51c and the second ohmic metal layer 51d have been formed, and the cross section in FIG. 15A corresponds to that of FIG. 12A, and the cross section in FIG. 15B corresponds to that of FIG. 12B. As shown in FIGS. 15A and 15B, a second inorganic insulating layer 53 is formed on the surface of the resin body 23 and the exposed semiconductor region. The second inorganic insulating layer 53 has a first opening 53a and a second opening 53b, which are located on the first ohmic metal layer 51c and the second ohmic metal layer 51d, respectively, and has a third opening 53c in the boundary areas located between the adjoining device sections. For the formation of the second inorganic insulating layer 53, a second silicon-based inorganic insulating film is grown over the entire surface of the substrate. The second silicon-based inorganic insulating layer can comprise, for example, SiON, SiN, and $SiO_2$, and in the present embodiment, a silicon oxynitride film (SiON) is used as the second silicon-based inorganic insulating layer. The second silicon-based inorganic insulating film is deposited by, for example, CVD. On the second silicon-based inorganic insulating layer, a third resist mask is produced by photolithography. The third resist mask has respective openings on the first ohmic metal layer 51c and the second ohmic metal layer 51d. The second silicon-based inorganic insulating film is etched with the third resist mask to form a second inorganic insulating layer 53. After the etching, the third resist mask is removed. These steps form the second inorganic insulating layer 53.

An electrode is formed for the photodiode. FIG. 16A shows a cross section corresponding to that of FIG. 12A, and FIG. 16B shows a cross section corresponding to that of FIG. 12B. As shown in FIGS. 16A and 16B, a patterned seed layer 51b and a patterned plated layer 51a are formed for the first electrode 25, the first wiring conductor 27, the first pad electrode 29, the second electrode 41, the second wiring conductor 45, the second pad electrode 43 and the second electrode. The wiring conductors are formed not directly on the resin body 23 but on the silicon-based inorganic insulating layer which intervenes therebetween, and the layer thus formed can reduce the peeling-off of the metallic conductors. In order to form the metal body, the base resist mask serving as a protective layer is formed by photolithography, and a metal layer for a seed layer (for example, TiW layer) is deposited by sputtering. Thereafter, a process of plating gold is carried out. A plated layer 51 having a desired pattern (for example, gold plated layer) is formed. After the plating process, the metal layer for the seed layer is etched using the plated layer 51a as a mask to form the seed layer 51b. This etching is performed by reactive ion etching using, for example, $SF_6$ gas.

A sequence of these processes are an example of a method of fabricating a semiconductor optical device 11 according to the present embodiment. As described above, the embodiment can provide a semiconductor optical device capable of reducing the capacitive coupling between the wiring conductors of the photodiode and the dark current of the photodiode, and can provide the method of fabricating the same.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A semiconductor optical device comprising:
    a substrate including a primary surface, the primary surface having first, second, third and fourth areas;
    a first conductivity-type semiconductor layer disposed on the third and fourth areas;
    a first semiconductor laminate for a photodiode, the first semiconductor laminate being disposed on the first conductivity-type semiconductor layer in the third area;
    a second semiconductor laminate for an optical waveguide, the second semiconductor laminate being disposed on the first conductivity-type semiconductor layer in the fourth area;
    a third semiconductor laminate disposed on the first conductivity-type semiconductor layer in the third area;
    a resin body disposed on the second, third and fourth areas;
    a first electrode connected with the first semiconductor laminate through a first opening of the resin body in the third area;
    a first pad electrode disposed on the first area; and
    a wiring conductor disposed on the resin body, the wiring conductor connecting the first electrode to the first pad electrode,
    the first semiconductor laminate having first, second, third and fourth sides,
    the second semiconductor laminate forming a butt-joint junction with the first side of the first semiconductor laminate to be coupled with the photodiode,
    the third semiconductor laminate being in contact with the second side of the first semiconductor laminate,
    the third and fourth sides of the first semiconductor laminate being covered with a semiconductor protective film disposed on the second area,
    the resin body covering the semiconductor protective film, the first semiconductor laminate, the second semiconductor laminate and the third semiconductor laminate,
    the first semiconductor laminate including a second conductivity-type semiconductor layer, the second conductivity-type semiconductor layer being in contact with the first electrode,
    the wiring conductor extending on a first side and a top of the resin body in the second and third areas and extending on the first area to the first pad electrode, and
    the first side of the resin body being disposed in the second area.

2. The semiconductor optical device according to claim 1, wherein the primary surface has a fifth area,
    the semiconductor optical device further comprising a multimode interferometer, the multimode interferometer being disposed on the fifth area and being optically coupled to the optical waveguide.

3. The semiconductor optical device according to claim 2, wherein the primary surface includes sixth, seventh and eighth areas, the first conductivity-type semiconductor layer is disposed on the sixth and seventh areas, and the resin body has a second side on the sixth area,
    the semiconductor optical device further comprising a second electrode connected to the first conductivity-type semiconductor layer on the seventh area, and a second pad electrode disposed on the seventh area and connected to the second electrode.

4. The semiconductor optical device according to claim 1, wherein the first side of the resin body is inclined at an angle of 70 degrees or less with respect to the primary surface of the substrate.

5. The semiconductor optical device according to claim 1, wherein
    the first semiconductor laminate includes a light receiving layer disposed between the first conductivity-type semiconductor layer and the second conductivity-type semiconductor layer,
    the light receiving layer includes GaInAs, and
    the semiconductor protective film includes an InP protective film.

6. The semiconductor optical device according to claim 1, wherein the resin body includes BCB resin.

7. The semiconductor optical device according to claim 1, further comprising an inorganic insulating film disposed on the first area and the resin body, wherein the wiring conductor is disposed on the inorganic insulating film.

* * * * *